United States Patent [19]

Pernici et al.

[11] Patent Number: 5,352,972
[45] Date of Patent: Oct. 4, 1994

[54] SAMPLED BAND-GAP VOLTAGE REFERENCE CIRCUIT

[75] Inventors: Sergio Pernici, Bergamo; Germano Nicollini, Piacenza, both of Italy

[73] Assignee: SGS-Thomson Microelectronics, S.r.l., Milan, Italy

[21] Appl. No.: 861,111

[22] Filed: Mar. 31, 1992

[30] Foreign Application Priority Data

Apr. 12, 1991 [IT] Italy ............... 001026 A/91

[51] Int. Cl.$^5$ .............................. G05F 3/16
[52] U.S. Cl. ........................... 323/313; 323/316; 307/296.6
[58] Field of Search ............... 323/316, 315, 313, 314; 307/296.6, 296.7, 296.8

[56] References Cited

U.S. PATENT DOCUMENTS

| | | | |
|---|---|---|---|
| 4,185,236 | 1/1980 | van de Plassche et al. | 323/1 |
| 4,251,743 | 2/1981 | Hareyama | 307/297 |
| 4,375,595 | 3/1983 | Ulmer et al. | 307/297 |
| 4,384,217 | 5/1983 | Tsividis | 307/297 |
| 4,458,200 | 7/1984 | Geller | 323/316 |
| 4,484,089 | 11/1984 | Viswanathan | 307/297 |
| 4,523,107 | 6/1985 | Peterson | 307/350 |
| 4,577,119 | 3/1986 | Kim et al. | 307/297 |
| 4,703,249 | 10/1987 | De La Plaza et al. | 323/316 |
| 4,706,013 | 11/1987 | Kuo | 323/316 |
| 4,785,231 | 11/1988 | Bohme et al. | 323/316 |
| 4,864,217 | 9/1989 | Bird | 323/316 |
| 5,059,820 | 10/1991 | Westwick | 307/296.6 |
| 5,059,832 | 10/1991 | Hughes | 307/490 |

FOREIGN PATENT DOCUMENTS

WO-A-8202806 8/1982 PCT Int'l Appl. .

OTHER PUBLICATIONS

Ferro et al., "A Floating CMOS Bandgap . . . " 24 JSSCC 690ff (Jun. 1989).

*Primary Examiner*—Steven L. Stephan
*Assistant Examiner*—Adolf Berhane

[57] ABSTRACT

A sampled band-gap voltage reference circuit which has quicker regeneration of the voltage reference signal after degeneration of the voltage reference signal due to additional loading. The voltage reference circuit prevents interference from the circuit source inputs to the operational amplifier by selective switching. The selective switching of the circuit allows the operational amplifier to regenerate the output voltage up to ten times quicker than prior art devices of the same size.

24 Claims, 2 Drawing Sheets

SAMPLED BAND-GAP VOLTAGE REFERENCE CIRCUIT

TECHNICAL FIELD OF THE INVENTION

The present invention relates to a sampled band-gap voltage reference circuit executable as part of integrated circuits in CMOS technology.

BACKGROUND OF THE INVENTION

The band-gap voltage reference circuit is well-known to the designers of analog circuits. This reference circuit provides a constant voltage as independent as possible of the environmental temperature at which the circuit operates. This type of circuit is present in many systems manufactured with integrated circuits. For example, a constant voltage reference is required for analog/digital converters. Such converters compare the value of a voltage reference signal against the value of samples to be converted.

The output voltage of the voltage reference circuit can be temporarily connected to various users. The circuits of such users constitute a load which the voltage reference circuit must be able to drive. When one or more of these load circuits require the use of the voltage reference output, the voltage reference signal can undergo a voltage degradation due to insertion of a load, for a certain period of time.

Voltage degradation under these circumstances occurs for only a certain period of time. The voltage reference circuit, however, must have the capability to quickly react to this degradation and rapidly restore the output voltage to the correct reference voltage value. Errors may occur if a load circuit is added to the voltage reference output during this degradation period. Thus, quick restoration to the correct voltage value is necessary so that the voltage reference circuit is available to user circuits without excessive delay. Additionally, a quick restoration period is necessary in order to minimize the possibility of errors due to the addition of load circuits during the degradation period.

Numerous circuit arrangements are known which provide a band-gap voltage reference of the time-continuous type (i.e., of the type which can be used for 100% of the time). One such circuit is disclosed in Gray and Mayer, "Analysis and Design of Analog Integrated Circuits", published by John Wiley & Sons. These circuits are generally manufactured using bipolar junction technology because their operating principle is based on intrinsic properties of bipolar junction transistors (BJT) as described in the above noted publication.

Complex systems are often executed in a single CMOS integrated circuit. Current technology enables an integrated circuit to be fabricated with both analog and digital circuits in a compact manner on the same integrated circuit. As is known in the art, such integrated circuits can contain vertical bipolar parasitic transistors which are operable at low frequencies. Such parasitic transistors can be placed in the integrated circuit without additional steps being added to the manufacturing process. Thus, it is currently possible to produce a band-gap voltage reference circuit having just two bipolar junction transistors, and the remainder of the integrated circuit fabricated in MOSFET technology (see Gray and Meyer above).

The operating principle of a band-gap voltage reference circuit is based on the compensating increases and decreases in the rate of voltage change due to changes in environmental temperature. That is, the voltage between the base and the emitter of one bipolar transistor decreases with the environmental temperature at the rate of approximately 2 mV/° C. Conversely, the proportional difference in the base-emitter voltage between two bipolar transistors operating at different current intensities is governed by the equation kT/q. The equation kT/q is given where k is Boltzmann's constant, q is the charge of the electron, and T is the temperature in degrees Kelvin. and C3. Capacitors C1, C2 and C3 are selectively switched utilizing switches S1, S2, S3 and S4. The switches are transitioned synchronously at appropriate frequencies so as to obtain a voltage reference signal $V_{ref}$ which is the weighted sum of $V_{be}$ and $\delta V_{be}$ at the output of the operational amplifier OP. The voltage reference $V_{ref}$ in this configuration is represented by the following equation:

$$V_{ref} = a_1 V_{be} + a_2 \delta V_{be}$$

This equation is given were the weights $a_1$ and $a_2$ are respectively equal to C1/C3 and C2/C3. Substituting the weights in the above equations results in the following equation:

$$V_{ref} = \frac{C1 V_{be}}{C3} + \frac{C2 \delta V_{be}}{C3}$$

Weights $a_1$ and $a_2$ (that is, the values C1, C2 and C3) can be chosen so as to make the voltage reference signal $V_{ref}$ independent of the environmental temperature. Thus, the values of the capacitors C1, C2 and C3 are selected to make the voltage reference signal $V_{ref}$ independent of temperature changes such that any increase in the voltage drop across one transistor due to a change in environmental temperature will be offset by a corresponding decrease in the voltage drop across the other transistor due to the same change in environmental temperature; and, vice versa.

The switches control the capacitors, but the switches also cancel the offset of the operational amplifier. An initial reset step is accomplished by short-circuiting the input and the output of the operational amplifier through switch S3 (closed or ON). Switches S1 and S2 are in a Utilizing the equation kT/q, we find the proportional difference in the base-emitter voltages of two bipolar transistors operating at different current levels increases with the temperature at the rate of approximately 0.2 mV/° C. Thus, the base-emitter voltage of one transistor will decrease at a rate of 2 mV/° C., while the difference between the base-emitter voltages of two transistors operating at different currents will increase at a rate of 0.2 mV/° C.

A substantially temperature-independent voltage is obtained by multiplying one voltage difference by an appropriate factor and adding it to the other voltage difference. That is, a decrease of the voltage difference $V_{be}$ in the first bipolar transistor due to a temperature change is compensated by the increase of the voltage difference $\delta V_{be}$ of the two bipolar transistors operating at different current intensities due to an identical temperature change; and, vice versa. Thus, the temperature independence of this circuit is based on the corresponding rates of change in the voltage difference of the first transistor and the corresponding rate of change in the voltage difference of the two transistors operating at different current values.

A particular type of band-gap voltage reference circuit is the sampled-time reference disclosed in Vittoz, "Design of High Performance Analog Circuits on Digital CMOS Chips", JSSC, June 1985. A known circuit of this type is shown in FIG. 1, wherein two constant current sources $I_1$ and $I_2$ of unequal value drive the emitters of respective diode-connected bipolar transistors T1 and T2. The voltages across transistors T1 and T2 are applied to a switched-capacitor integrator.

The switched-capacitor integrator comprises an operational amplifier OP combined with capacitors C1, C2 position such that the input voltage is derived from a first common node of a first transistor operating at a first current value.

In a second step, switch S3 opens and the output of the operational amplifier is fed back to the operational amplifier OP through capacitor C3. The switches S1 and S2 are also moved to a position where the input voltage is derived from a second common node of a second transistor operating at a second current valve. The reference voltage is generated during this second step and remains available until a subsequent reset step. Usually, this reference voltage availability step is much longer than the reset step for practical reasons.

The reference circuit described above has the disadvantage of being slow in restoring the output voltage value to the correct reference voltage value when it is loaded by several user circuits in succession. The interference of capacitors C1 and C2 is a primary reason for the slow speed at which the reference circuit restores to the correct voltage reference value after loading.

In order to accurately compensate for temperature changes, there must be a rather large ratio between the capacitance of capacitors C1+C2 and the capacitance of capacitor C3. This ratio between C1+C2 and C3 must usually be higher than 10. After the reset step, any feedback voltage of the operational amplifier from the output to the inverting input passes through capacitor C3. This feedback voltage is attenuated by capacitors C1 and C2 largely due to the high capacitive ratio.

This capacitive attenuation of the feedback signal causes the operational amplifier to operate within a reduced bandwidth. This attenuation prevents maximum utilization of the operational amplifier's potential bandwidth. The higher the ratio between C1+C2 and C3, the narrower the bandwidth. The settling time of an operational amplifier depends on its passband or the bandwidth utilized by the operational amplifier. A reduced passband translates into a slower regeneration period for the voltage reference signal $V_{ref}$. Thus, the attenuation caused by capacitors C1 and C2 narrows the reference circuit passband which slows the regeneration period of the circuit.

In order to shorten the regeneration period, a faster than necessary operational amplifier can be used. Faster operational amplifiers, however, occupy a much larger area of the integrated circuit and absorb more power than the smaller operational amplifiers. Integrated circuit area and power consumption should be minimized under most circumstances. Thus, in many instances, these faster operational amplifiers cannot be effectively utilized in an integrated circuit with area constraints and power consumption limitations. Additionally, in many instances the slower operational amplifiers cannot be utilized in the voltage reference circuit because of the excessive delay times.

SUMMARY OF THE INVENTION

The aim of the invention is to provide a sampled band-gap voltage reference circuit executable as part of integrated circuits in CMOS technology which has faster recovery to a correct output voltage value after circuit loading.

Another object of the invention is to provide a reference voltage circuit with a reduced silicon chip occupation area and a reduced power consumption.

The invention achieves this aim, as well as other objects and advantages as will become apparent from the description, with a sampled band-gap voltage reference circuit having two compensating voltage sources, a switched-capacitor integrator, and an isolation switch. This circuit has a first bipolar diode and a second bipolar diode having the same types of terminals connected to fixed voltage sources. These diodes also have the same type of opposite terminals driven by respective current sources. These current sources are constant and have unequal current values.

The circuit also possesses a switched-capacitor integrator. This integrator has three capacitors, an operational amplifier, and various switches. The first capacitor is connected between a first common node and a first switch that is adapted to be alternatively connected to either the opposite terminal of the first diode or the opposite terminal of the second diode. The second capacitor is connected between said first common node and a second switch that is adapted to be alternatively connected to either the opposite terminal of the second diode or to the fixed voltage. The amplifier has an input and an output and a third switch connected between the output and the input of the amplifier. The third capacitor has a terminal connected to the input of the amplifier and an opposite terminal connected to a fourth switch wherein said fourth switch can alternatively couple the third capacitor to either the output of the amplifier or a voltage source. This circuit also has a fifth switch connected between said common node and the input of said first amplifier for isolating the first and second capacitors from the operational amplifier input node under certain circumstances.

BRIEF DESCRIPTION OF THE DRAWINGS

The invention is now described in greater detail with reference to some preferred embodiments thereof, illustrated in the accompanying drawings given only by way of nonlimitative example.

DETAILED DESCRIPTION

Figure 2:
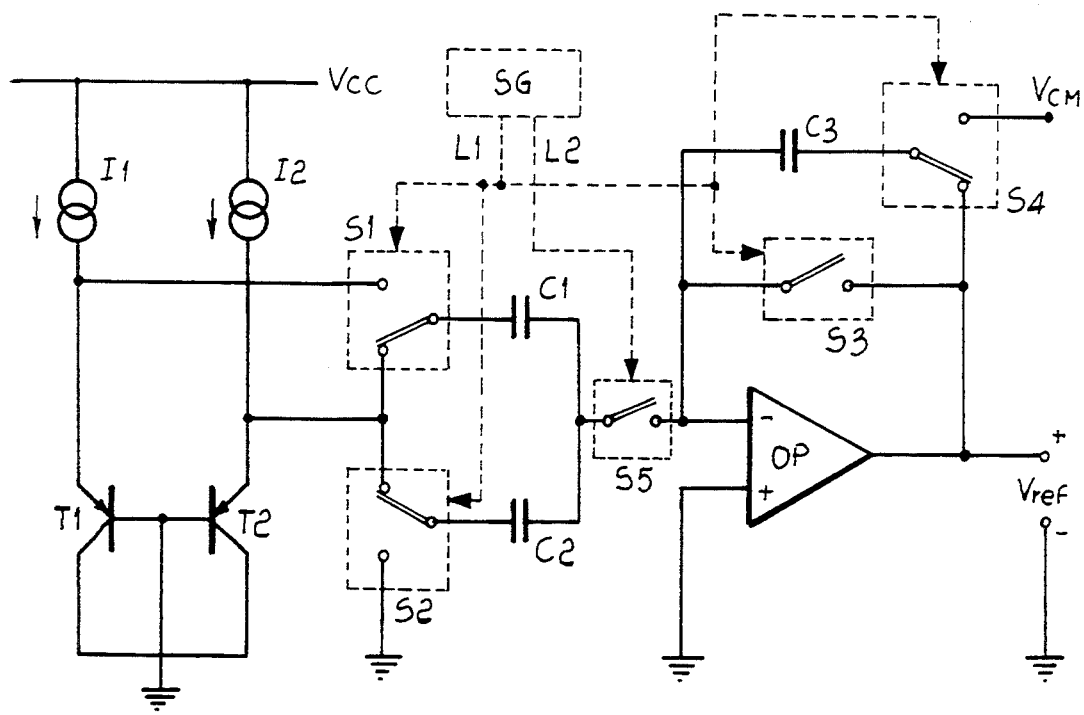
FIG. 2 is a sampled band-gap voltage reference circuit according to a first preferred embodiment of the invention.
Figure 4:
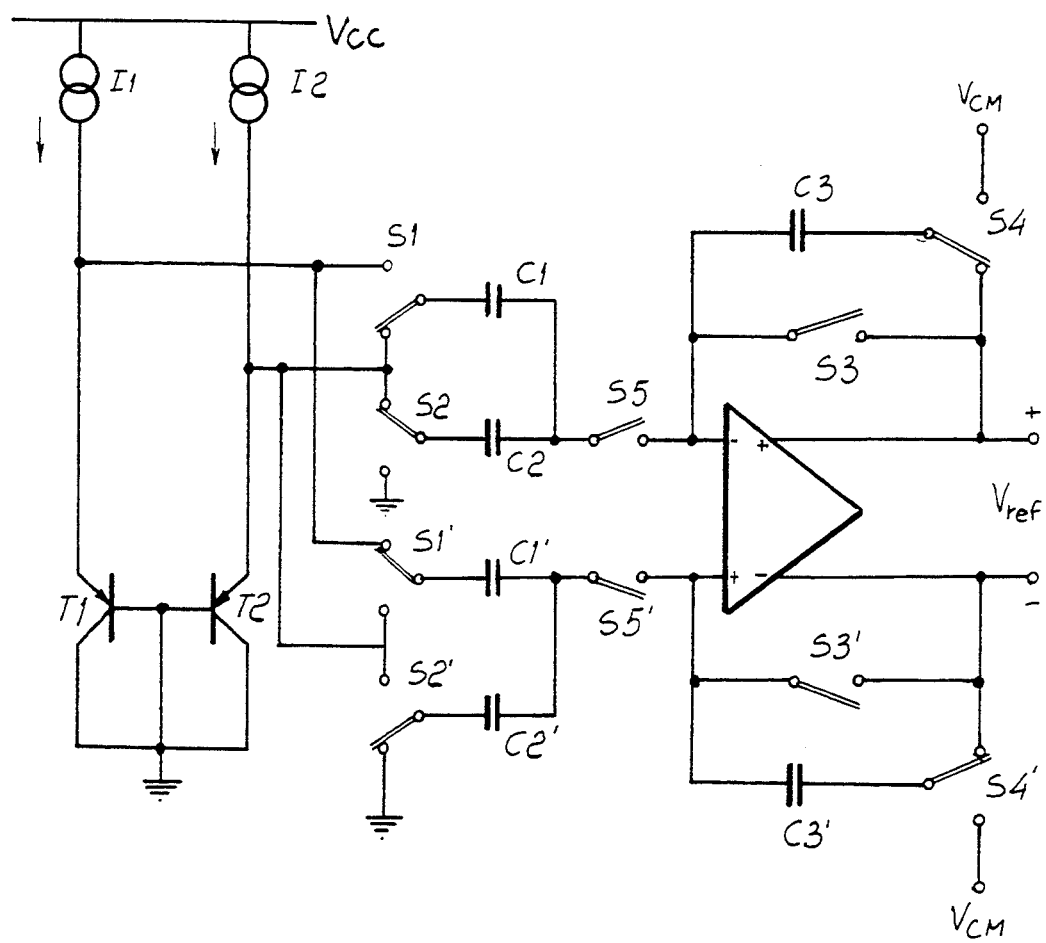
FIG. 4 is a sampled band-gap voltage reference circuit according to a second embodiment of the invention.

The sampled band-gap voltage reference circuit according to a first preferred embodiment of the invention is shown in FIG. 2. This circuit has two current sources I1 and I2 which generate constant currents of different values. These current sources I1 and I2 drive the respective emitters of the two bipolar transistors T1 and T2. Transistors T1 and T2 are connected so that their collectors and their bases are connected to the ground potential. This circuit configuration couples transistors T1 and T2 in a diode connection.

The voltage drop between the emitter and the ground in each of the two transistors, T1 and T2, equals the voltage $V_{be}$ between the base and the emitter of the transistors. The switch S2 connects capacitor C2 alternatively to the ground potential or to the emitter of transistor T2, while the switch S1 connects capacitor C1 alternatively to the emitter of transistor T1 or to the emitter of transistor T2.

The opposite terminals of the two capacitors C1 and C2 are connected to switch S5. Switch S5 is connected to the inverting input of an operational amplifier OP. The non-inverting input of operational amplifier OP is connected to the ground potential. The output of the operational amplifier OP is coupled to the inverting input of the operational amplifier OP by means of capacitor C3 at certain times, and is coupled to the inverting input through switch S3 at other times. Capacitor C3 has one terminal coupled to switch S4 which alternatively couples capacitor C3 to a constant charging voltage $V_{CM}$ or the output terminal of operational amplifier OP.

A switching signal source SG produces signals which control the transition of the switches S1–S5 by means of control lines L1 and L2. Lines L1 and L2 are shown as broken lines in FIG. 2. The output of the operational amplifier OP provides the required output reference voltage $V_{ref}$.

As can be seen in FIG. 2, the circuit according to the invention differs from the circuits known in the art due to the introduction of switch S5 between the capacitors C1 and C2 and the input of the operational amplifier OP. During the initial "reset" step described above, the switch S5 is closed (ON) and the circuit operates like the circuit in FIG. 1. During the subsequent step, or "hold" step, switches S1 through S4 transition to the alternative position. Switch S5 remains closed (ON) momentarily, however, until the reference voltage is made available. This delayed transition can be seen on signal L2 in FIG. 3. After the reference voltage signal is made available, switch S5 is opened (OFF) (transition of signal L2 from high to low in FIG. 3) and remains open until a subsequent reset step.

Figure 1:
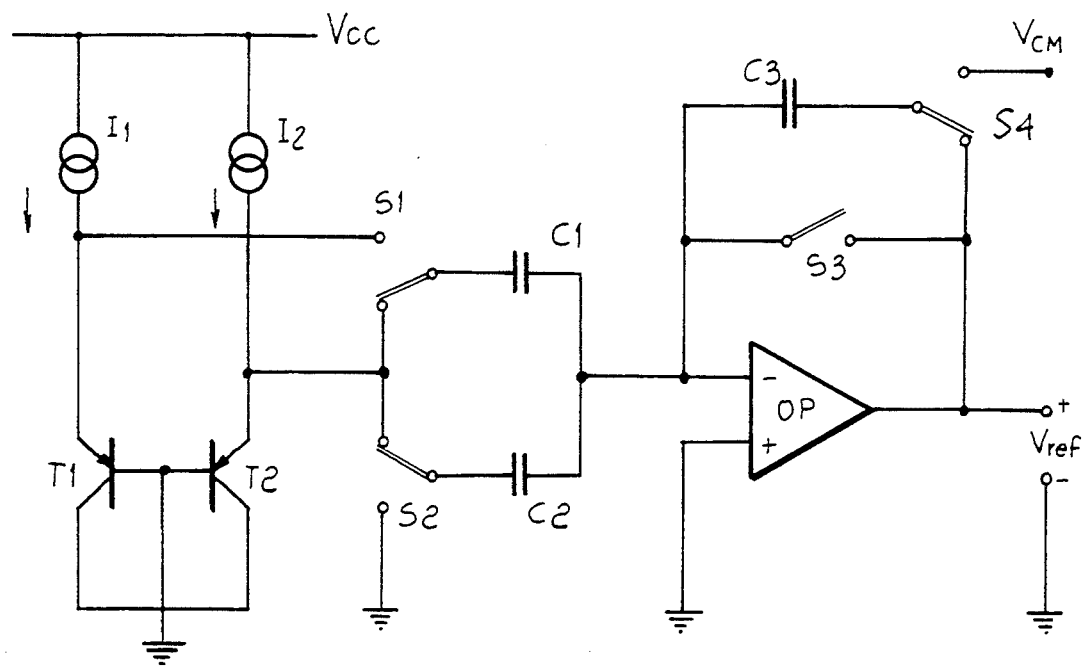
FIG. 1 is a sampled band-gap voltage reference circuit according to the prior art.

The reference voltage signal $V_{ref}$ from the operational amplifier OP does not vary like the circuit of FIG. 1 when the output of the operational amplifier is loaded. Switch S5 isolates the operational amplifier from capacitors C1 and C2 after it transitions to a nonconductive state. Thus, capacitors C1 and C2 cannot influence and attenuate the feedback signal, or narrow the passband of the operational amplifier.

A more detailed explanation of the structure and function of the circuit is as follows. It is obvious that when the switch S5 opens (OFF), the feedback to the input of the operational amplifier OP is constituted only by the capacitor C3. Capacitor C3 is arranged between the input and the output of operational amplifier OP and is charged at an appropriate voltage when switch S4 connects one terminal of capacitor C3 to the constant charging voltage $V_{cm}$.

After switch S4 transitions so as to connect capacitor C3 to the output of the operational amplifier, the capacitor C3 maintains its charge during the entire reference availability step since its terminals do not discharge. Capacitor C3 holds its charge until degradation of the output voltage signal caused by loading. When loaded, capacitor C3 discharges in order to compensate for the degradation.

With switch S5 closed (ON), this discharge from capacitor C3 is attenuated by capacitors C1 and C2. When S5 is open (OFF), however, the discharge from capacitor C3 is fed back to the input of the operational amplifier unchanged by the attenuation of capacitors C1 and C2. Thus, no attenuation by capacitors C1 and C2 is possible in the signal fed back to the input of the operational amplifier after S5 is open (OFF) in this circuit.

The operational amplifier therefore operates at its maximum bandwidth and therefore at the maximum speed compatible with its structure. It is therefore not necessary to increase the size of the operational amplifier in order to compensate for a bandwidth decrease. Additionally, no increase in power consumption is associated with the increased speed of the operational amplifier.

In this manner, the operational amplifier responds quicker to the degradation of the output reference voltage caused by increased loading on the output voltage node. Accordingly, the load circuits which previously altered the voltage reference $V_{ref}$ value for long periods of time do not affect the output voltage as significantly. Typically, the operational amplifier returns the output to the correct value ten times quicker than in the circuit of FIG. 1.

Figure 3:
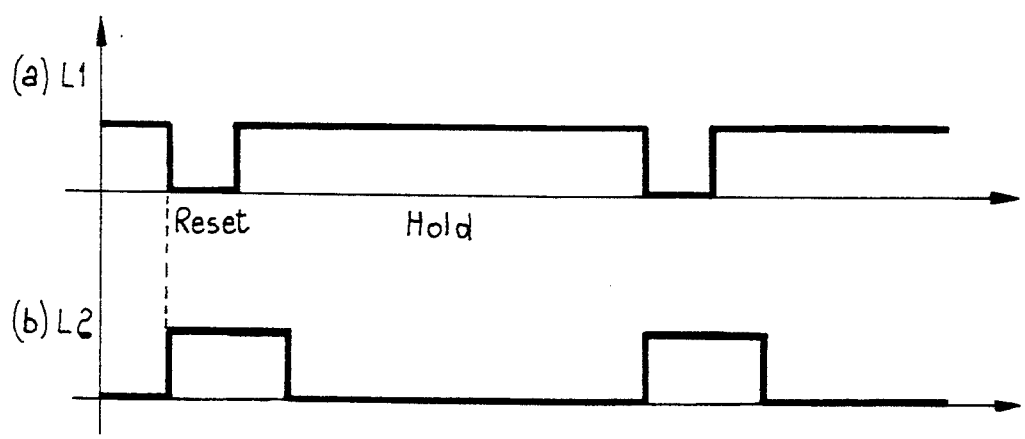
FIG. 3 is a plot of some switching waveforms for switches which belong to the circuit of FIG. 2.

In FIG. 3, waveform (a) is the control signal on control line L1 for the switches S1, S2, S3 and S4. Waveform (b), present on the control line L2, is the control signal for the switch S5. By way of example, an operating cycle of approximately 125 μs is typical for an application of this reference voltage circuit to an analog/digital converter. As can be seen in the reset step in signal (a), L1 is low or at a zero value and all the gates S1–S4 are in opposite positions from that shown in FIG. 2. L1 subsequently changes to a high value and switches the position of switches S1–S4 to the positions shown in FIG. 2.

As can be seen in FIG. 3(b), L2 is high during the entire time period that L1 is low, and L2 remains high for an extended period after L1 goes high. When L2 is high, switch S5 is in the opposite position than is shown in FIG. 2, or it is closed (ON). After a specified period of time sufficient to allow for the reference voltage signal $V_{ref}$ to be taken from the output node, L2 goes low and switches S5 open (OFF) as the position disclosed in FIG. 2. In this position, capacitor C1 and C2 are isolated from the input node of the operational amplifier, and the capacitors are prevented from attenuating the feedback voltage.

The invention can also be provided in the form shown in FIG. 2. In this embodiment, the voltage reference circuit has a differential operational amplifier and a differential (rather than single-ended) output. The circuit is similar to the one of FIG. 2, with most elements performing identical functions. The operational amplifier is of the fully differential type, with both branches providing feedback. One feedback signal passes through the branch made up of C3, S3, S4 and the other feedback signal passes through the branch made up of C3', S3', S4'. The circuit also comprises the known elements of C1, C2, S1, S2, S5, with a second pair of capacitors C1', C2' and related switches S1', S2' and S5'. Capacitors C1' and C2' with related switches S1', S2' and S5' connect the emitters of transistors T1 and T2 to the second input node of the operational amplifier OP.

This second embodiment operates similarly to the embodiment in FIG. 2 and has the same advantages. This embodiment, however, has the additional advantages of a fully-differential structure. Fully-differential structures possess a lower sensitivity to power supply noise, higher output dynamics, and a greater compensation ability due to charge injection during switching.

Preferred embodiments of the invention have been described, but it is understood that the person skilled in the art can devise other equivalent modifications and variations. For example, the circuit might be executed without a switch S4 for the capacitor C3, which in this case might be permanently parallel-connected to the switch S3.

We claim:

1. A sampled band-gap reference circuit, comprising:
   a first current source and a first diode element joined at a first node and connected in series between first and second voltage terminals,
   a second current source and a second diode element joined at a second node and connected in series between said first and second voltage terminals, said first and second diode elements having different current densities therethrough,
   a first switch having a first terminal thereof selectively connectable to second and third terminals thereof, said second and third terminals thereof connected respectively to said first and second nodes,
   a second switch having a first terminal thereof selectively connectable to second and third terminals thereof, said second and third terminals thereof connected respectively to said second node and said second voltage terminal,
   a first capacitor having a first terminal thereof connected to said first terminal of said first switch,
   a second capacitor having a first terminal thereof connected to said first terminal of said second switch, wherein second terminals of said first and second capacitors are connected in common to a third node,
   a third switch having first and second terminals, said first terminal thereof connected to said third node,
   an amplifier having an input and an output, the input thereof connected to said second terminal of said third switch,
   a fourth switch having first and second terminals thereof connected between said input and said output of said amplifier, and
   a third capacitor having a first terminal thereof connected to said input of said amplifier and a second terminal thereof coupled to said output of said amplifier.

2. A sampled band-gap reference circuit as recited in claim 1 including a fifth switch having a first terminal thereof selectively connectable to second and third terminals thereof wherein said first terminal thereof is connected to said second terminal of said third capacitor, said second terminal thereof is connected to said output of said amplifier and said third terminal thereof is connected to a voltage reference terminal, wherein said second terminal of said third capacitor is selectively connectable to either said output of said amplifier or said voltage reference terminal.

3. A sampled band-gap reference circuit as recited in claim 2 including a control circuit for generating periodic switching signals at a selected frequency for controlling the switching of said first, second, third, fourth and fifth switches.

4. A sampled band-gap reference circuit as recited in claim 1 including a control circuit for generating periodic switching signals at a selected frequency for controlling the switching of said first, second, third, and fourth switches.

5. A sampled band-gap reference circuit as recited in claim 1 wherein each of said diode elements comprises a bipolar transistor having base and collector terminals thereof connected in common.

6. A sampled band-gap reference circuit as recited in claim 1 wherein said second voltage terminal comprises a common ground for said reference circuit.

7. A sampled band-gap reference circuit, comprising:
   a first current source and a first diode element joined at a first node and connected in series between first and second voltage terminals,
   a second current source and a second diode element joined at a second node and connected in series between said first and second voltage terminals, said first and second current sources having different currents therethrough,
   a first switch having a first terminal thereof selectively connectable to second and third terminals thereof, said second and third terminals thereof connected respectively to said first and second nodes,
   a second switch having a first terminal thereof selectively connectable to second and third terminals thereof, said second and third terminals thereof connected respectively to said second node and said second voltage terminal,
   a first capacitor having a first terminal thereof connected to said first terminal of said first switch,
   a second capacitor having a first terminal thereof connected to said first terminal of said second switch, wherein second terminals of said first and second capacitors are connected in common to a third node,
   a third switch having first and second terminals, said first terminal thereof connected to said third node,
   a differential amplifier having a first input and a corresponding first output and a second input with a corresponding second output, the first input thereof connected to said second terminal of said third switch,
   a fourth switch having first and second terminals thereof connected between said first input and said first output of said amplifier,
   a fifth switch having a first terminal thereof selectively connectable to second and third terminals thereof, said second terminal thereof connected to a voltage reference terminal and said third terminal thereof connected to said first output of said amplifier,
   a third capacitor having a first terminal thereof connected to said first input of said amplifier and a second terminal thereof connected to said first terminal of said fifth switch,
   a sixth switch having a first terminal thereof selectively connectable to second and third terminals thereof, said second and third terminals thereof connected respectively to said first and second nodes,
   a seventh switch having a first terminal thereof selectively connectable to second and third terminals thereof, said second and third terminals thereof connected respectively to said second node and said second voltage terminal, a fourth capacitor having a first terminal thereof connected to said first terminal of said sixth switch, a fifth capacitor having a first terminal thereof connected to said first terminal of said seventh switch, wherein second terminals of said fourth and fifth capacitors are connected in common to a fourth node, an eighth switch having first and second terminals, said first terminal thereof connected to said fourth node, said second terminal thereof connected to said second input of said amplifier, a ninth switch having first and second terminals thereof connected between said second input and said second output of said amplifier, a sixth capacitor having a first terminal thereof and a second terminal thereof, said first terminal thereof connected to said second input of said amplifier, and a tenth switch having a first terminal thereof selectively connectable to second and third terminals, said first terminal thereof connected to said second terminal of said sixth capacitor, said second terminal thereof connected to the voltage reference terminal and second third terminal connected to said second output of said amplifier.

8. A sampled band-gap reference circuit as recited in claim 7 including a control circuit for generating periodic switching signals at a selected frequency for controlling the switching of said first, second, third, fourth, fifth, sixth, seventh, eighth, ninth and tenth switches.

9. A sampled band-gap reference circuit as recited in claim 7 wherein each of said diode elements comprises a bipolar transistor having base and collector terminals thereof connected in common.

10. A sampled band-gap reference circuit as recited in claim 7 wherein said second voltage terminal comprises a common ground for said reference circuit.

11. A method for generating a sampled band-gap reference voltage, comprising the steps of:
during a first time period,
  (a) connecting a first terminal of a first capacitor to a first node which is the junction of a first current source connected in series with a first diode element between first and second power terminals and connecting a second terminal of said first capacitor to an input of an amplifier,
  (b) connecting a first terminal of a second capacitor to said second power terminal and connecting a second terminal thereof to said input of said amplifier,
  (c) connecting an output of said amplifier to said input thereof,
  (d) connecting a first terminal of a third capacitor to said input of said amplifier and connecting a second terminal thereof to a voltage reference terminal,
during a second time period,
  (a) connecting said first terminal of said first capacitor to a second node which is the junction of a second current source connected in series with a second diode element between said first and second power terminals, said first and second constant current sources producing different constant currents,
  (b) connecting said first terminal of said second capacitor to said second node,
  (c) opening the connection between said output and said input of said amplifier,
  (d) connecting said third capacitor between said output and said input of said amplifier, and
during a third time period,
  (a) disconnecting the second terminals of said first and second capacitors from said input of said amplifier, wherein said reference voltage is produced at said output of said amplifier during said third time period.

12. A method for generating a sampled band-gap reference voltage as recited in claim 11 wherein said third time period is substantially longer than said first and second time periods.

13. A method for generating a sampled band-gap reference voltage as recited in claim 11 wherein said first, said second and said third time periods are repeated sequentially in order.

14. A method for generating a sampled band-gap reference voltage as recited in claim 11 wherein said second power terminal functions as a common ground.

15. A method for generating a sampled band-gap differential reference voltage, comprising the steps of:
during a first time period,
  (a) connecting a first terminal of a first capacitor to a first node which is the junction of a first current source connected in series with a first diode element between first and second power terminals and connecting a second terminal of said first capacitor to the first input of an amplifier,
  (b) connecting a first terminal of a second capacitor to said second power terminal and connecting a second terminal thereof to said first input of said amplifier,
  (c) connecting a first output of said amplifier to the first input thereof,
  (d) connecting a first terminal of a third capacitor to said first input of said amplifier and connecting a second terminal thereof to a voltage reference terminal,
  (e) connecting a first terminal of a fourth capacitor to a second node which is the junction of a second current source connected in series with a second diode element between said first and second power terminals, said first and second current sources producing different constant currents, and a second terminal thereof to a second input of said amplifier,
  (f) connecting a first terminal of a fifth capacitor to said second node and a second terminal thereof to said second input of said amplifier,
  (g) connecting a second output of said amplifier to said second input of said amplifier, wherein said first and second inputs to said amplifier are differential inputs and said first and second outputs of said amplifier are differential outputs, and
  (h) connecting a first terminal of a sixth capacitor to said second input of said amplifier and a second terminal thereof to said voltage reference terminal;
during a second time period,
  (a) connecting said first terminal of said first capacitor to said second node,
  (b) connecting said first terminal of said second capacitor to said second node,
  (c) opening the connections between said outputs and said inputs of said amplifier, (d) connecting said third capacitor between said first output and said first input of said amplifier, and (e) connecting said first terminal of said fourth capacitor to said first node, (f) connecting said first terminal of said fifth capacitor to said second power terminal, and (g) connecting said second terminal of said sixth capacitor to said second output of said amplifier;

and, during a third time period, (a) disconnecting the second terminals of said first, second, fourth and fifth capacitors from said inputs of said amplifier, wherein said differential reference voltage is produced between said first and second outputs of said amplifier during said third time period.

16. A method for generating a sampled band-gap reference voltage as recited in claim 15 wherein said first, said second and said third time periods are repeated sequentially in order.

17. A method for generating a sampled band-gap reference voltage as recited in claim 15 wherein said second power terminal functions as a common ground.

18. A method for generating a sampled band-gap reference voltage as recited in claim 15 wherein said third time period is substantially longer than said first and second time periods.

19. A sampled band-gap reference circuit, comprising:

a first current source and a first diode element joined at a first node and connected in series between first and second voltage terminals, a second current source and a second diode element joined at a second node and connected in series between said first and second voltage terminals, said first and second diode elements having different current densities therethrough, a first switch having a first terminal thereof selectively connectable to second and third terminals thereof, said second and third terminals thereof connected respectively to said first and second nodes, a second switch having a first terminal thereof selectively connectable to second and third terminals thereof, said second and third terminals thereof connected respectively to said second node and said second voltage terminal, a first capacitor having a first terminal thereof connected to said first terminal of said first switch, a second capacitor having a first terminal thereof connected to said first terminal of said second switch, wherein second terminals of said first and second capacitors are connected in common to a third node, a third switch having first and second terminals, said first terminal thereof being directly connected to said third node in any state of said third switch, an amplifier having an input and an output, the input thereof being directly connected to said second terminal of said third switch in any state of said third switch, a fourth switch having first and second terminals thereof connected between said input and said output of said amplifier, and a third capacitor having a first terminal thereof connected to said input of said amplifier and a second terminal thereof coupled to said output of said amplifier.

20. A sampled band-gap reference circuit as recited in claim 19, further comprising a fifth switch having a first terminal thereof selectively connectable to second and third terminals thereof wherein said first terminal thereof is connected to said second terminal of said third capacitor, said second terminal thereof is connected to said output of said amplifier and said third terminal thereof is connected to a voltage reference terminal, wherein said second terminal of said third capacitor is selectively connectable to either said output of said amplifier or said voltage reference terminal.

21. A sampled band-gap reference circuit as recited in claim 20 including a control circuit for generating periodic switching signals at a selected frequency for controlling the switching of said first, second, third, fourth and fifth switches.

22. A sampled band-gap reference circuit as recited in claim 19, including a control circuit for generating periodic switching signals at a selected frequency for controlling the switching of said first, second, third and fourth switches.

23. A sampled band-gap reference circuit as recited in claim 19, wherein each of said diode elements comprises a bipolar transistor having base and collector terminals thereof connected in common.

24. A sampled band-gap reference circuit as recited in claim 19, wherein said second voltage terminal comprises a common ground for said reference circuit.

* * * * *